United States Patent
Wang et al.

(10) Patent No.: US 7,539,068 B2
(45) Date of Patent: May 26, 2009

(54) MEMORY AND MULTI-STATE SENSE AMPLIFIER THEREOF

(75) Inventors: Min-Chuan Wang, Taichung (TW);
Ching-Sheng Lin, Tainan County (TW);
Chia-Pao Chang, Taipei County (TW);
Keng-Li Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 170 days.

(21) Appl. No.: 11/797,725

(22) Filed: May 7, 2007

(65) Prior Publication Data

US 2008/0019192 A1 Jan. 24, 2008

(30) Foreign Application Priority Data

Jul. 20, 2006 (TW) .............................. 95126508 A

(51) Int. Cl.
*G11C 7/10* (2006.01)
(52) U.S. Cl. ............. 365/189.06; 365/158; 365/189.07; 365/189.09; 365/205; 365/210
(58) Field of Classification Search ............ 365/189.06, 365/158, 189.07, 189.09, 171, 205, 210
See application file for complete search history.

(56) References Cited

U.S. PATENT DOCUMENTS

| | | | |
|---|---|---|---|
| 6,501,697 B1 * | 12/2002 | Perner et al. ................. | 365/209 |
| 6,700,814 B1 | 3/2004 | Nahas et al. | |
| 7,075,844 B2 | 7/2006 | Pagliato et al. | |
| 2006/0050584 A1 | 3/2006 | Gogl et al. | |
| 2006/0104136 A1 | 5/2006 | Gogl et al. | |
| 2006/0152970 A1 | 7/2006 | DeBrosse et al. | |
| 2007/0247892 A1 * | 10/2007 | Egerer ........................ | 365/148 |

FOREIGN PATENT DOCUMENTS

| | | |
|---|---|---|
| JP | 2003-297090 A | 10/2003 |
| JP | 2005-259301 A | 9/2005 |

OTHER PUBLICATIONS

Edward K. S. Au et.al, "A Novel Current-Mode Sensing Scheme for Magnetic Tunnel Junction MRAM" (IEEE Transactions on Magnetics, vol. 40, No. 2, Mar. 2004).

* cited by examiner

*Primary Examiner*—Tuan T Nguyen
*Assistant Examiner*—Toan Le
(74) *Attorney, Agent, or Firm*—Birch, Stewart, Kolasch & Birch, LLP

(57) ABSTRACT

The invention provides a multi-state sense amplifier, coupled to at least one memory cell and a plurality of reference cells. The source follower, coupled between a first node and the output terminal of the memory cell, clamps the voltage drop across the memory cell to generate a memory cell current flowing through the first node. The source follower circuit, coupled between a plurality of second nodes and the output terminals of the reference cells, clamps the voltage drops across the reference cells to generate a plurality of reference currents respectively flowing through the second nodes. The current mirror circuit, coupled to the first node and the second nodes, duplicates the memory cell current of the first node to affect the reference currents on the second nodes, thereby generating a memory cell voltage on the first node and a plurality of reference voltages on the second nodes.

30 Claims, 8 Drawing Sheets

| Memory Mode | First Resistance | Second Resistance | Total Resistance | Stored Data |
|---|---|---|---|---|
| Mode 1 | R1max | R2max | R1max // R2max | 11 |
| Mode 2 | R1max | R2min | R1max // R2min | 10 |
| Mode 3 | R1min | R2max | R1min // R2max | 01 |
| Mode 4 | R1min | R2min | R1min // R2min | 00 |

FIG. 2 (PRIOR ART)

MEMORY AND MULTI-STATE SENSE AMPLIFIER THEREOF

BACKGROUND OF THE INVENTION

1. Field of the Invention

The invention relates to memories and more particularly to memories with changeable resistance.

2. Description of the Related Art

A Magnetic Random Access Memory (MRAM) is a non-volatile memory. Different from a conventional memory, which stores data in the form of charge or current, MRAM stores data with magnetic storage cells. Because MRAM has high cell density and high access speed, it is poised to emerge as the mainstream technology in the memory fabrication industry.

FIG. 1 shows a conventional MRAM cell 100. MRAM cell 100 comprises a transistor 102, and two Magnetic Tunnel Junction (MTJ) devices 104 and 106. The MTJ devices 104 and 106 are coupled in parallel between a read bit line RBL and a node 108. MTJ devices typically comprise a plurality of interleaved ferromagnetic layers and insulating layers. A magnetic field applied to the MRAM cell 100 shifts the polarity of the ferromagnetic layers changing the resistance of the MTJ devices 104 and 106. Thus, the MTJ devices 104 and 106 can be switched between two levels of resistance.

A transistor 102 is coupled between the node 108 and a ground. The gate of the transistor 102 is coupled to a word line WL. When a high voltage is applied to the word line WL to turn on the transistor 102, the MTJ devices 104 and 106 are connected in parallel between the read bit line RBL and ground. The read bit line RBL is biased by a constant voltage and coupled to a sense amplifier, thus, the current level flowing through the read bit line RBL changes with the resistance of the MTJ devices 104 and 106. The sense amplifier can then read data stored in MRAM cell 100 by detecting the current level. Because the size of the two MTJ devices 104 and 106 are different, the changeable resistance level of the MTJ devices is also different. For example, if the MTJ device 104 can be switched between resistance level $R_{1max}$ and $R_{1min}$, and the MTJ device 106 can be switched between resistance level $R_{2max}$ and $R_{2min}$, the total resistance of the MRAM cell 100 can then be switched between four levels of $R_{1max}//R_{2max}$, $R_{1max}//R_{2min}$, $R_{1min}//R_{2max}$, and $R_{1min}//R_{2min}$. Thus, the MRAM cell 100 has four memory states, each capable of storing 2 bits of data. FIG. 2 is a table 200 showing the relationship between the resistance level of the MRAM cell 100 and corresponding data stored in the MRAM cell 100. The four kinds of data stored in the MRAM cell 100 are respectively 11, 10, 01, and 00.

Because an MRAM comprises a plurality of MRAM cells 100, an output circuit coupled must be coupled to the bit line to detect data stored in a specific MRAM cell. The design of the output circuit heavily affects access time and performance of the MRAM. If an output circuit detects the current or voltage of the bit line with a multi-state sense amplifier, the access time is greatly reduced and the performance of the MRAM is improved.

The multiple bit lines and word lines of a memory induce parasitic capacitance. When a memory cell is turned on, the memory cell is directly coupled to the multi-state sense amplifier, and the voltage drops across the MTJ devices induce a current flowing between the path between the memory cell and the multi-state sense amplifier. According to the charge conservation theorem $Q = C \times V = I \times t$, when the memory cell is turned on, the current cannot immediately charge the parasitic capacitance coupled to the current path to force the transistors of the sense amplifier into triode regions, and the output voltage of the sense amplifier is pulled up to a logic high level, increasing the access time of the MRAM.

A method is thus provided for ameliorating the described problems. The method couples the output terminals of reference cells to switches to be turned on only when the memory cell is turned on to clamp the voltage of the output terminals of the reference cells to a certain voltage. Thus, the voltages of transistors of the sense amplifier are prevented from being pulled up to the logic high level reducing access time by half.

BRIEF SUMMARY OF THE INVENTION

The invention provides a multi-state sense amplifier, coupled to at least one memory cell and a plurality of reference cells. An exemplary embodiment of the multi-state sense amplifier comprises a source follower, a source follower circuit, and a current mirror circuit. The source follower, coupled between a first node and the output terminal of the memory cell, clamps the voltage drop across the memory cell to generate a memory cell current flowing through the first node. The source follower circuit, coupled between a plurality of second nodes and the output terminals of the reference cells, clamps the voltage drops across the reference cells to generate a plurality of reference currents respectively flowing through the second nodes. The current mirror circuit, coupled to the first node and the second nodes, duplicates the memory cell current of the first node to affect the reference currents on the second nodes, thus generating a memory cell voltage on the first node and a plurality of reference voltages on the second nodes.

The invention also provides a memory. An exemplary embodiment of the memory comprises at least one memory cell, a plurality of reference cells, a multi-state sense amplifier, a comparator, and a decoder. The resistance of the memory cell is changeable. The reference cells have different resistance. The multi-state sense amplifier, coupled to the memory cell and the reference cells, generates a memory cell voltage and a plurality of reference voltages according to the resistance of the memory cell and the resistance of the reference cells. The comparator, coupled to the multi-state sense amplifier, compares the memory cell voltage and the reference voltages to obtain a comparison result signal. The decoder, coupled to the comparator, decodes the comparison result signals to obtain N bits of data stored in the memory cell.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 2 is a table showing a corresponding relationship between the resistance level of an MRAM cell and data stored in the MRAM cell;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
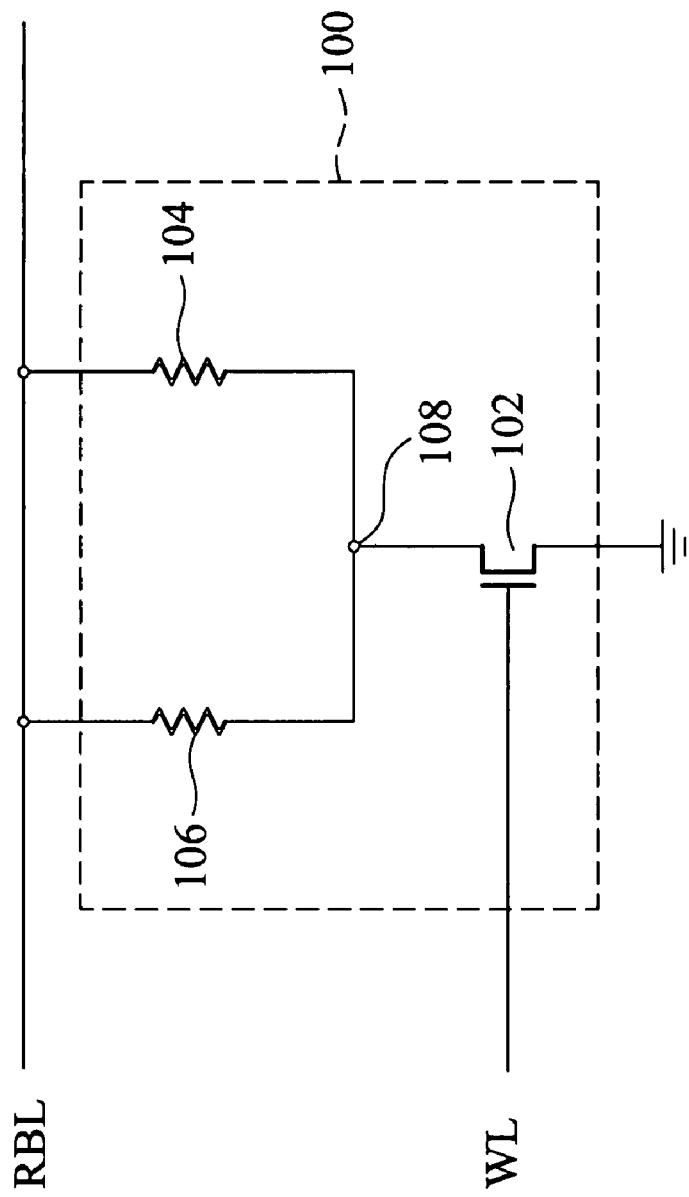
FIG. 1 shows a conventional MRAM cell.
Figure 3:
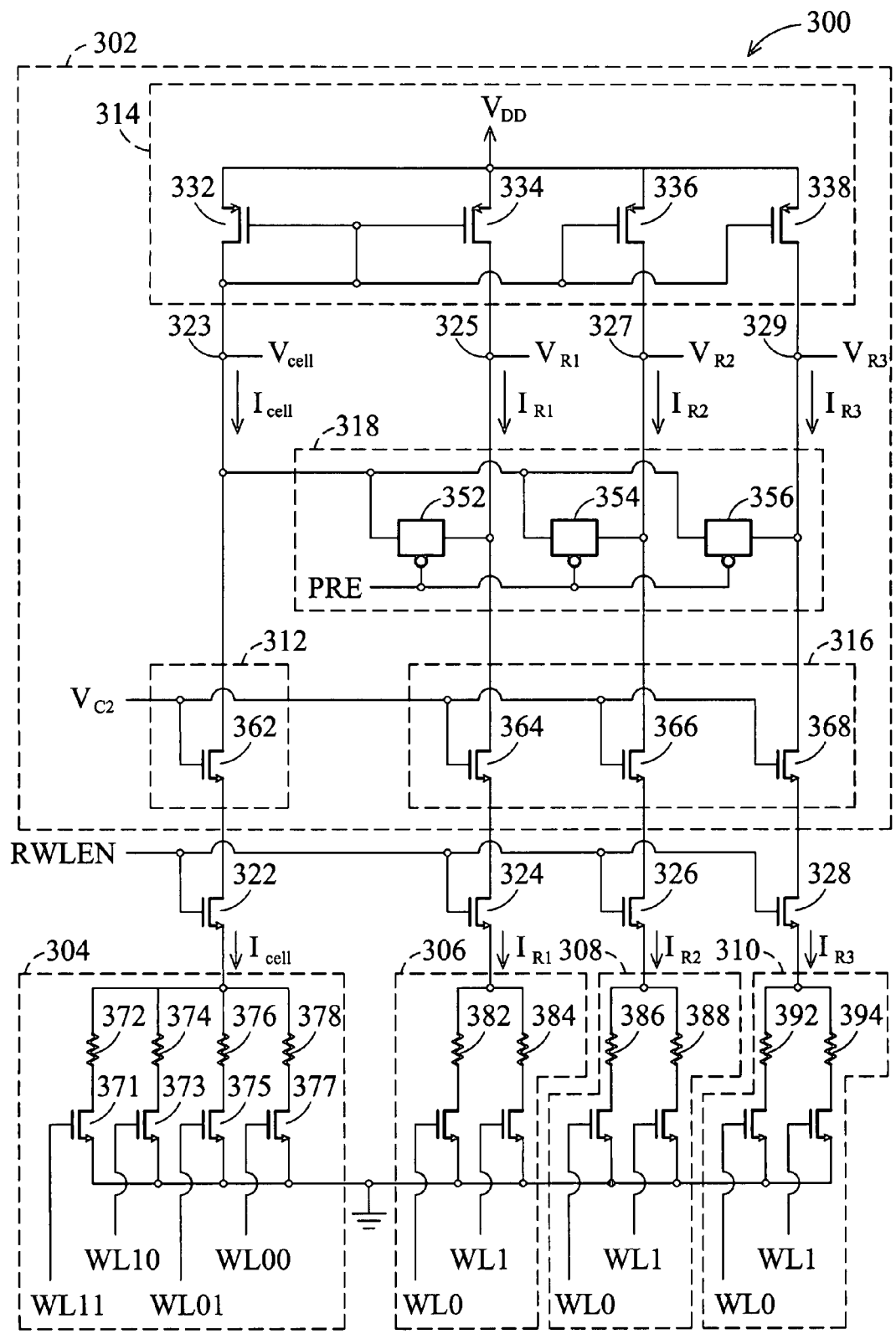
FIG. 3 is a circuit diagram of an embodiment of a portion of an MRAM according to the invention.

FIG. 3 shows a portion of the circuits of an MRAM 300 according to the invention. MRAM 300 includes a four-state sense amplifier 302, at least one four-state MRAM cell 304, and reference cells 306, 308, and 310. MRAM 300 comprises a plurality of MRAM cells 304, each having a structure similar to MRAM cell 100 of FIG. 1, and coupled between a bit line and a ground, wherein the bit line is further coupled to the sense amplifier 302. When an MRAM cell 304 is selected by a word line, the transistor 102 of the selected MRAM cell 304 is turned on to couple the MTJ devices 104 and 106 between the sense amplifier 302 and the ground. Thus, the sense amplifier 302 can detect the resistance of the selected MRAM cell for reading stored data.

For brevity, FIG. 3 shows only the selected MRAM cell 304. Because the resistance of the MRAM cell 304 can be switched between four levels, the four resistors 372, 374, 376, and 378 represents one of four resistance levels, $R_{1max}//R_{2max}$, $R_{1max}//R_{2min}$, $R_{1min}//R_{2max}$, and $R_{1min}//R_{2min}$ respectively. The gates of transistors 371, 372, 375, and 377 are respectively coupled to word lines WL11, WL10, WL01, and WL00. Each word line is selected to turn on the corresponding transistor; the corresponding resistor 372, 374, 376, or 378 is coupled between the ground and the sense amplifier 302. For example, when the word line WL10 is selected, the transistor 373 is turned on to couple the resistor 374 between the ground and the sense amplifier 302, and the total resistance of the MRAM cell 304 is $R_{1max}//R_{2min}$. The simplified circuit of MRAM cell 304 shown in FIG. 3 is provided for illustration only, the real circuit structure of the MRAM cell 304 may be similar to the MRAM cell 100 shown in FIG. 1.

Reference cells 306, 308, and 310 each having a different resistance that can be compared with the resistance of MRAM cell 304 to obtain stored data. Each of the reference cells is formed by multiple resistors coupled between the output terminals thereof and a ground. In one embodiment, each of the reference cells comprises two resistors respectively corresponding to one of the four resistances of the MRAM cell 304. For example, the reference cell 306 comprises a resistor 382 having resistance of $R_{1min}//R_{2min}$ and a resistor 384 having resistance of $R_{1min}//R_{2max}$, the reference cell 308 comprises a resistor 386 having resistance of $R_{1min}//R_{2max}$ and a resistor 388 having resistance of $R_{1max}//R_{2min}$, and the reference cell 310 comprises a resistor 392 having resistance of $R_{1max}//R_{2min}$ and a resistor 394 having resistance of $R_{1max}//R_{2max}$. Because the MRAM cell 304 has four ($2^2$) resistance levels, the number of the reference cells is three ($2^2-1=3$). When one of the word lines WL11, WL10, WL01, WL00 is selected, the word lines WL0 and WL1 are selected at the same time to couple the two resistors of the reference cells in parallel between the sense amplifier 302 and ground.

The sense amplifier 302 is a four-state sense amplifier and generates a memory cell voltage $V_{cell}$ and a plurality of reference voltages $V_{R1}$, $V_{R2}$, and $V_{R3}$ according to the resistance of the MRAM cell 304 and the reference cells 306, 308, and 310. A transistor 322 is coupled between the sense amplifier 302 and the bit line coupled to the output terminal of the MRAM cell 304, and has a gate coupled to a read-word-line enable signal RWLEN which turns on the transistor 322 to couple the MRAM cell 304 to the sense amplifier 302. Accordingly, transistors 324, 326, and 328 are coupled between the sense amplifier 302 and the reference cells 306, 308, and 310, triggered by the read-word-line enable signal RWLEN to couple the reference cells 306, 308, and 310 to the sense amplifier 302.

The sense amplifier 302 includes a source follower 312, a source follower circuit 316, a current mirror circuit 314, and a pre-charge circuit 318. The sense amplifier 302 is coupled to the output terminal of the MRAM cell 304 through the source follower 312, which limits the voltage of the output terminal of the MRAM cell 304 to a certain level thus keeping the voltage drop across the MRAM cell 304 constant. The source follower 312 comprises an NMOS transistor 362, having a gate coupled to a second clamp voltage $V_{C2}$, a source coupled to the output terminal of the MRAM cell 304 through the transistor 322, and a drain coupled to a first node 323. The second clamp voltage $V_{C2}$ is about 0.7V. Because the voltage of the source of the NMOS transistor 362 is determined according to the clamp voltage $V_{C2}$ of about 0.7V, the voltage drop across the MRAM cell 304 is kept at a constant of about 0.3V. Thus, the memory cell current $I_{cell}$ flowing through the MRAM cell 304 is determined according to the resistance of the MRAM cell 304.

The sense amplifier 302 is coupled to the output terminals of the reference cells 306, 308, and 310 through the source follower circuit 316. The source follower circuit 316 clamps the voltages of the output terminals of the reference cells to keep the voltage drops across the reference cells 306, 308, and 310 identical to the voltage drop across the memory cell 304. The source follower circuit 316 includes NMOS transistors 364, 366, and 368, having gates coupled to the second clamp voltage $V_{C2}$ and sources coupled to the output terminals of the reference cells 306, 308, and 310. Because the voltage of the sources of the NMOS transistor 364, 366, and 368 are determined according to the clamp voltage $V_{C2}$ of about 0.3V, the voltage drops across the reference cells 306, 308, and 310 are kept at a constant of about 0.3V. Thus, the reference currents $I_{R1}$, $I_{R2}$, and $I_{R3}$ flowing through the reference cells 306, 308, and 310 are determined according to the resistance of the reference cells 306, 308, and 310.

The current mirror circuit 314 is coupled between a voltage source $V_{DD}$ and a first node 323 and second nodes 325, 327, and 329. The current mirror circuit 314 includes PMOS transistors 332, 334, 336, and 338. The PMOS transistor 332 has a source coupled to the voltage source $V_{DD}$ and a gate and a drain coupled to the first node 323. The PMOS transistor 332 receives the memory cell current $I_{cell}$ and generates a memory cell voltage $V_{cell}$ at the first node 323. The PMOS transistors 334, 336, and 338 have sources coupled to the voltage source $V_{DD}$, gates coupled to the first node 323, and drains coupled to the second nodes 325, 327, and 329. Because the voltages of the sources and the gates of the PMOS transistors 334, 336, and 338 are respectively the voltage source $V_{DD}$ and the memory cell voltage $V_{cell}$, and the currents flowing through the drains of the PMOS transistors 334, 336, and 338 are respectively the reference currents $I_{R1}$, $I_{R2}$, and $I_{R3}$, the currents flowing through the drains of the PMOS transistors 334, 336, and 338 therefore cause the voltage drops across the PMOS transistors 334, 336, and 338 and respectively generate the reference voltages $V_{R1}$, $V_{R2}$, and $V_{R3}$ at the second nodes 325, 327, and 329. Thus, the reference voltages $V_{R1}$, $V_{R2}$, and $V_{R3}$ respectively reflect the resistance of the reference cells 306, 308, and 310.

The pre-charge circuit 318 is coupled between the first node 323 and the second nodes 325, 327, and 329. The pre-charge circuit 318 comprises a plurality of switches 352, 354, and 356, respectively coupled between the first node 323 and one of the second nodes 325, 327, and 329. The pre-charge circuit 318 turns on switches 352, 354, and 356 according to a pre-charge signal PRE to couple the first node 323 and the second nodes 325, 327, and 329 before the MRAM cell 304 is accessed, thus, resetting the memory cell voltage $V_{cell}$ and the reference voltages $V_{R1}$, $V_{R2}$, and $V_{R3}$. For example, when the pre-charge signal PRE turns on the switch 352, the first node 323 is coupled with the second node 325, keeping the voltages of the first node 323 and the second node 325 identical.

Figure 4:
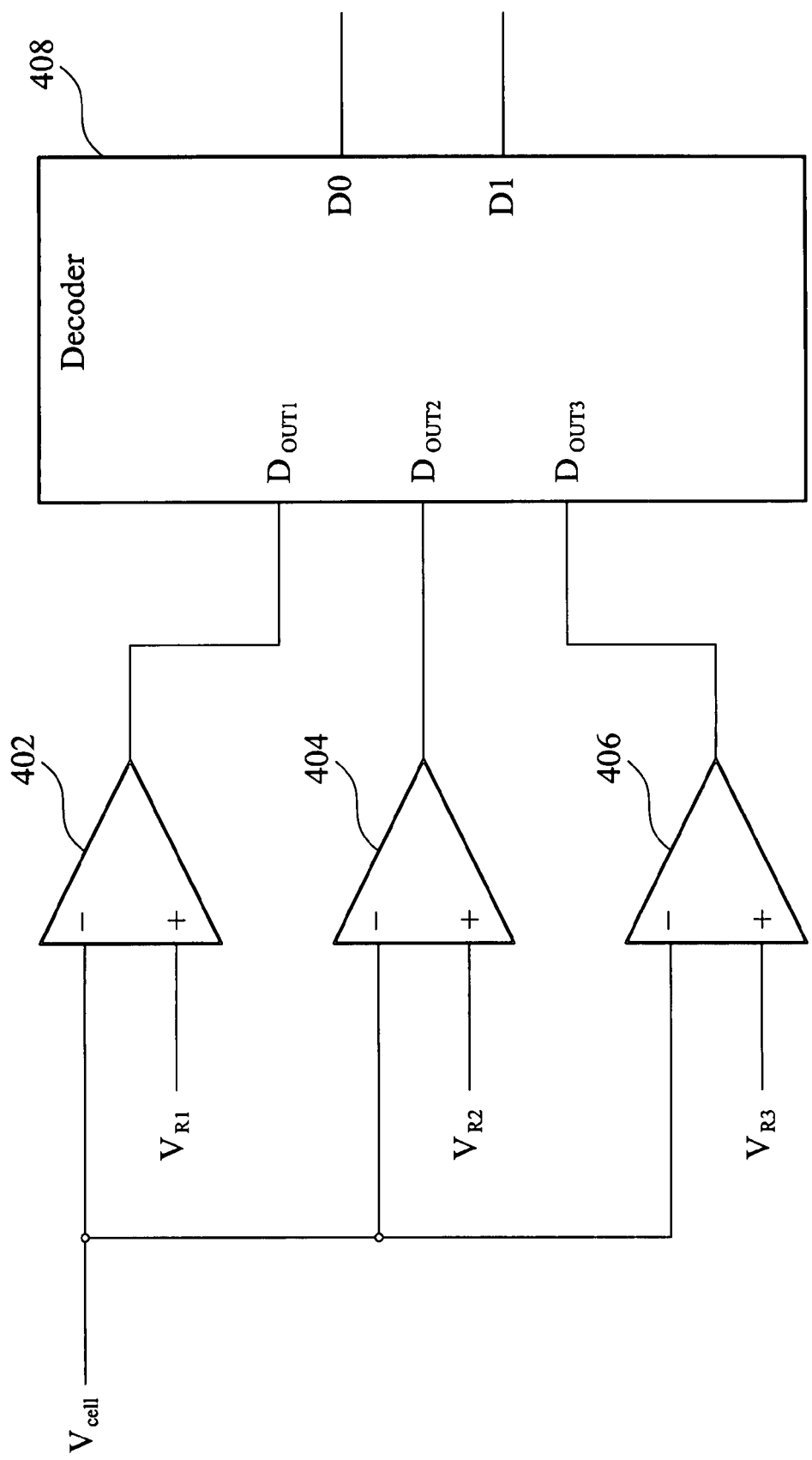
FIG. 4 shows comparators and a decoder of an MRAM according to the invention.

When the sense amplifier 302 generates the memory cell voltage $V_{cell}$ and the reference voltages $V_{R1}$, $V_{R2}$, and $V_{R3}$, the voltages $V_{cell}$, $V_{R1}$, $V_{R2}$, and $V_{R3}$ are processed by a comparator and a decoder to obtain the data bits stored in the MRAM cell 304. FIG. 4 shows the comparators 402, 404, and 406 and the decoder 408 comprised by the MRAM 300 according to the invention. The comparators 402, 404, and 406 compare the memory cell voltage $V_{cell}$ with the reference voltages $V_{R1}$, $V_{R2}$, and $V_{R3}$ to generate the comparison result signals $D_{OUT1}$, $D_{OUT2}$, and $D_{OUT3}$. The decoder 408 then decodes the comparison results signals $D_{OUT1}$, $D_{OUT2}$, and $D_{OUT3}$ to obtain the 2-bit data D0 and D1 stored in the MRAM cell 304.

The sense amplifier 302, the reference sells 306, 308, and 310, and the comparators 402, 404, and 406, and the decoder 408 provided by the invention form an output circuit of a memory. When an MRAM cell is selected, the MRAM 300 transforms the resistance of the selected MRAM cell 302 to corresponding 2-bit data D0 and D1 with the sense amplifier 302, the comparators 402, 404 and 406, and the decoder 408. The output circuit is not only suitable for MRAM, but also suitable for any memory composed of memory cells with changeable resistance, such as Phase Change Memory (PCM), to improve the performance thereof. Additionally, the output circuit can be used in any multiple-state memory. In one embodiment, if any memory cell of the memory stores N-bit data, an output circuit comprising an $2^N$-state sense amplifier and ($2^N-1$) reference cells and comparators can be used to extract the N-bit data stored in specific memory cell of the memory.

Figure 5:
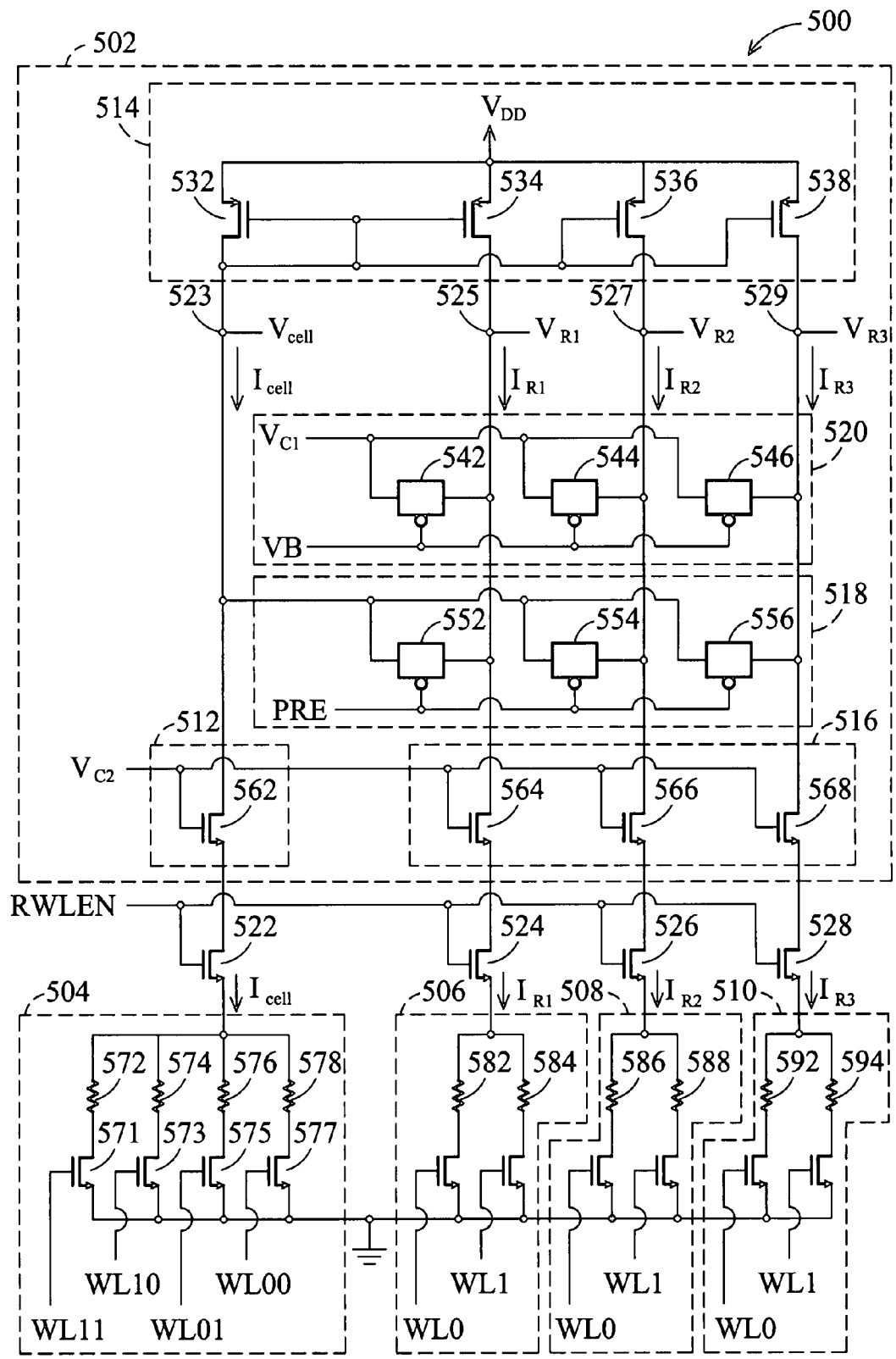
FIG. 5 is a circuit diagram of another embodiment of a portion of an MRAM according to the invention.

FIG. 5 shows a portion of the circuits of an MRAM 500 according to the invention. Only the sense amplifier 502 of MRAM 500 is different from MRAM 300 in FIG. 3. The MRAM 500 includes a four-state sense amplifier 502, at least one four-state MRAM cell 504, and reference cells 506, 508, and 510. The sense amplifier 502 generates a memory cell voltage $V_{cell}$ and a plurality of reference voltages $V_{R1}$, $V_{R2}$, and $V_{R3}$ according to the resistance of the MRAM cell 504 and the reference cells 506, 508, and 510. The MRAM 500 further comprises the comparators 402, 404, and 406 and the decoder 408 shown in FIG. 4. After the sense amplifier 502 generates the memory cell voltage $V_{cell}$ and the reference voltages $V_{R1}$, $V_{R2}$, and $V_{R3}$, the memory cell voltage $V_{cell}$ and the reference voltages $V_{R1}$, $V_{R2}$, and $V_{R3}$ are processed by the comparators 402, 404, and 406 and the decoder 408 to obtain the data bits D0 and D1 stored in the MRAM cell 504.

Figure 6A:
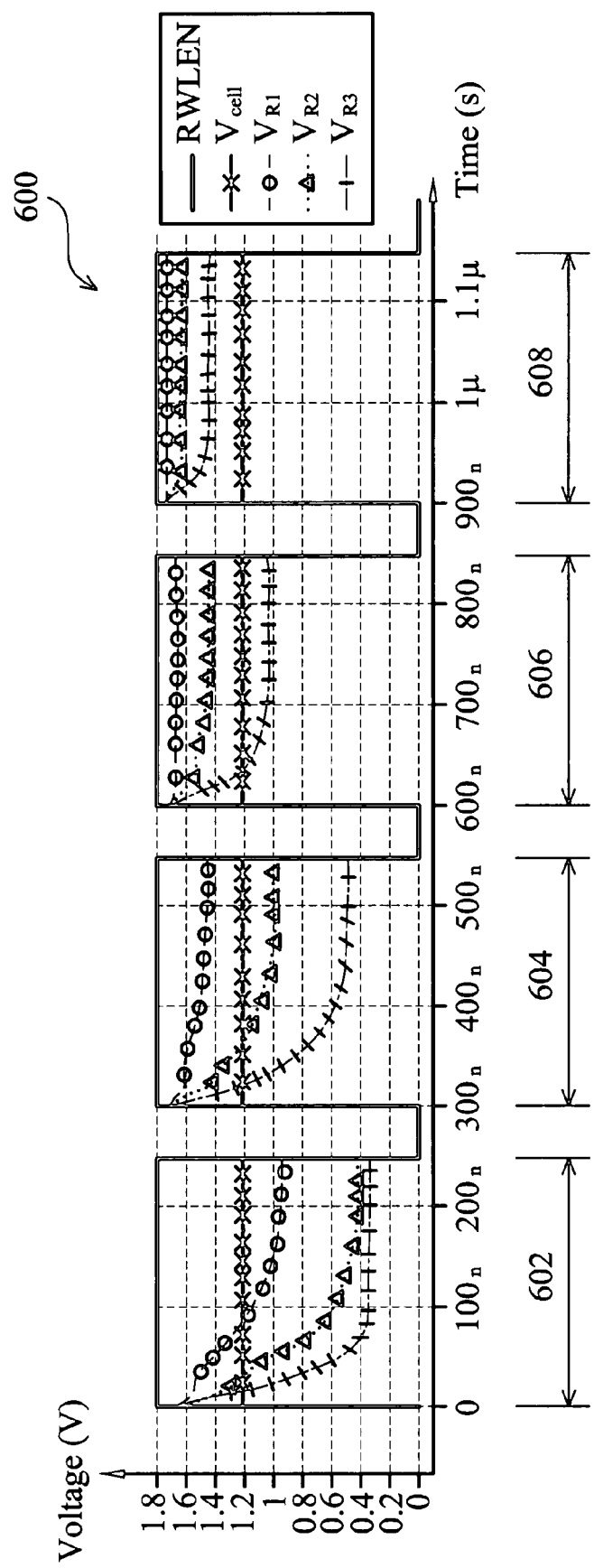
FIG. 6a shows a relationship between a memory cell voltage and the corresponding reference voltages generated by the sense amplifier of FIG. 3.

The sense amplifier 502 includes a source follower 512, a source follower circuit 516, a current mirror circuit 514, a pre-charge circuit 518, and a voltage clamp circuit 520. The sense amplifier 502 is different from the sense amplifier 302 only in that the voltage clamp circuit 520 corrects the defect of the sense amplifier 302. FIG. 6a shows a corresponding relationship between the memory cell voltage $V_{cell}$ and the reference voltages $V_{R1}$, $V_{R2}$, and $V_{R3}$ generated by the sense amplifier 302 of FIG. 3. During the periods 602, 604, 606, and 608, the read word line enable signal RWLEN is enabled to couple the MRAM cell 304 with the sense amplifier 302. During the periods 602, 604, 606, and 608, the word lines WL11, WL10, WL01, and WL00 are respectively enabled. Thus, the resistance of the MRAM cell 304 during the periods 602, 604, 606, and 608 are respectively the resistance of resistors 372, 374, 376, and 378.

As periods 602, 604, 606, and 608 begin, the reference voltages $V_{R1}$, $V_{R2}$, and $V_{R3}$ are pulled up the voltage source level $V_{DD}$ while MRAM cell 304 is coupled to the sense amplifier 302, and the reference voltages are restored to the normal level being available for the decoder 408 to decode after waiting for tens of nano seconds. This is because the gates of the PMOS transistors 336 and 338 are coupled to the first node 323, and the MRAM cell 304 must draw charge from the first node 323 to generate the memory cell current $I_{cell}$, delaying the saturation of the PMOS transistors 334, 336, and 338. Thus, the access time of the MRAM cell 304 is increased and the performance of the MRAM 300 is degraded.

Figure 6B:
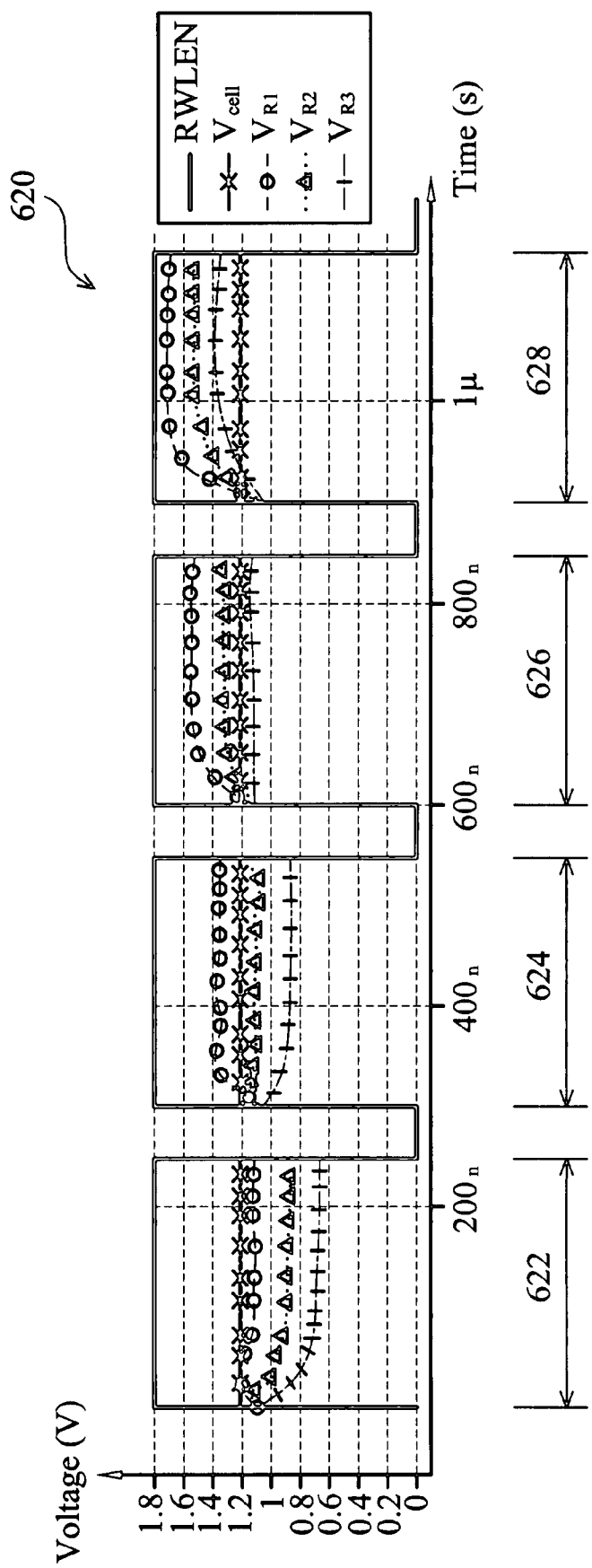
FIG. 6b shows a relationship between a memory cell voltage and the corresponding reference voltages generated by the sense amplifier of FIG. 5.

To correct this defect, voltage clamp circuit 520 is added to the sense amplifier 502. When the MRAM cell 504 is coupled to the sense amplifier 502 the voltage clamp circuit 520 couples to and clamps voltages of the second nodes 525, 527, and 529 to the first clamp voltage $V_{C1}$ according to a voltage clamp signal $V_B$. Charge is thus drawn from the first node 523 to generate the memory cell current $I_{cell}$. The voltage clamp circuit 520 comprises switches 542, 544, and 546 coupled between the first clamp voltage $V_{C1}$ and the second nodes 525, 527, and 529. The voltage clamp signal $V_B$ turns on the switches 542, 544, and 546 to clamp the voltages of the second nodes 525, 527, and 529 at the first clamp voltage $V_{C1}$. The voltages of the second nodes 525, 527, and 529 are thus prevented from being pulled up to the voltage source level $V_{DD}$ as shown in FIG. 6a. FIG. 6b shows a corresponding relationship between the memory cell voltage $V_{cell}$ and the reference voltages $V_{R1}$, $V_{R2}$, and $V_{R3}$ generated by the sense amplifier 502 of FIG. 5, wherein during the periods 622, 624, 626, and 628 of FIG. 6b the operations of the sense amplifier 502 are executed correspondingly to the periods 602, 604, 606, and 608 of FIG. 6a. It is shown in FIG. 6b that the reference voltages $V_{R1}$, $V_{R2}$, and $V_{R3}$ is not pulled up to the voltage source level $V_{DD}$ again, decreasing the access time of the MRAM cell 504 by about 50 ns and improving performance of the MRAM 500.

Figure 7:
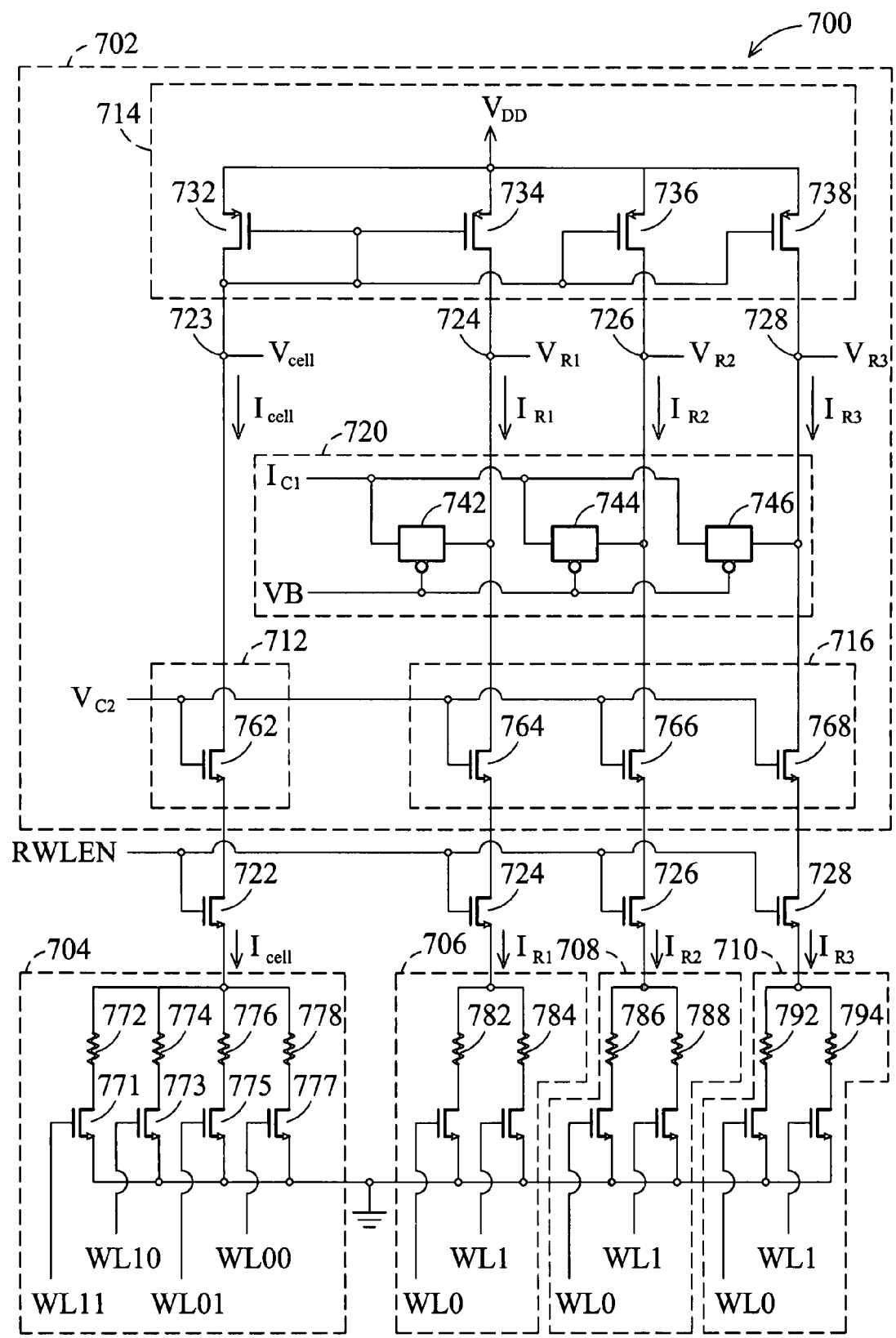
FIG. 7 is a circuit diagram of another embodiment of a portion of an MRAM according to the invention.

FIG. 7 shows a portion of the circuits of an MRAM 700 according to the invention. The MRAM 700 is different from the MRAM 500 of FIG. 5 only in omission of the pre-charge circuit 518. Because the pre-charge circuit 518 is not a necessary module for the sense amplifier 702, the pre-charge circuit 518 is deleted from the sense amplifier 702 of FIG. 7.

The invention provides an output circuit of a memory. The memory is composed of a plurality of memory cells with changeable resistance. The output circuit comprises a multi-state sense amplifier, at least one multiple-state memory cell, a plurality of reference cells, a plurality of comparators, and a decoder. Because the output circuit is equipped with the sense amplifier to facilitate memory cell access, access time of the memory cell is reduced.

While the invention has been described by way of example and in terms of embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-state sense amplifier, coupled to at least one memory cell and a plurality of reference cells, comprising:
   a source follower, coupled between a first node and the output terminal of the memory cell, clamping the voltage drop across the memory cell to generate a memory cell current flowing through the first node;
   a source follower circuit, coupled between a plurality of second nodes and the output terminals of the reference cells, clamping the voltage drops across the reference cells to generate a plurality of reference currents respectively flowing through the second nodes; and
   a current mirror circuit, coupled to the first node and the second nodes, duplicating the memory cell current of the first node to affect the reference currents on the second nodes, thereby generating a memory cell voltage on the first node and a plurality of reference voltages on the second nodes.

2. The multi-state sense amplifier as claimed in claim 1, wherein the resistance of the memory cell is changeable, the level of the memory cell current is determined according to the resistance of the memory cell, and the levels of the reference currents are respectively determined according to the resistances of the reference cells.

3. The multi-state sense amplifier as claimed in claim 1, wherein the relative level between the memory cell voltage and the reference voltages reflects the relative level between the resistance of the memory cell and the resistances of the reference cells.

4. The multi-state sense amplifier as claimed in claim 1, wherein the multi-state sense amplifier further comprises a pre-charge circuit, coupled to the first node and the second nodes, coupling the first node and the second nodes according to a pre-charge signal to make the reference voltages identical to the memory cell voltage before the memory cell is read.

5. The multi-state sense amplifier as claimed in claim 4, wherein the pre-charge circuit comprises a plurality of first switches, respectively coupled between the first node and one of the second nodes, and the pre-charge signal turns on the first switches to couple the first node and the second nodes.

6. The multi-state sense amplifier as claimed in claim 1, wherein the multi-state sense amplifier further comprises a voltage clamp circuit, coupled to the second nodes, keeping the voltages of the second nodes at a first clamp voltage according to a voltage clamp signal when the memory cell is coupled to the multi-state sense amplifier.

7. The multi-state sense amplifier as claimed in claim 6, wherein the voltage clamp circuit comprises a plurality of second switches, respectively coupled between the first clamp voltage and one of the second nodes, and the voltage clamp signal turns on the second switches to couple the second nodes to the first clamp voltage.

8. The multi-state sense amplifier as claimed in claim 1, wherein the current mirror circuit comprises:
   a first transistor, having a source coupled to a voltage source and a gate and a drain coupled to the first node, and generating the memory cell voltage on the first node; and
   a plurality of second transistors, having sources coupled to the voltage source, gates coupled to the first node, and drains respectively coupled to one of the second nodes, and generating the reference voltages on the second nodes.

9. The multi-state sense amplifier as claimed in claim 1, wherein the source follower comprises a third transistor, having a gate coupled to a second clamp voltage, a drain coupled to the first node, and a source coupled to the output terminal of the memory cell, and clamping the voltage drop across the memory cell, and the source follower circuit comprises a plurality of fourth transistors, having gates coupled to the second clamp voltage, drains respectively coupled to one of the second nodes, and sources coupled to one of the output terminals of the reference cells.

10. The multi-state sense amplifier as claimed in claim 1, wherein the memory cell is a Magnetic Random Access Memory (MRAM) cell having $2^N$ steady resistance states, each reference cell having a different resistance, and the number of the reference cells is $(2^N-1)$, wherein N is a number of the bits stored in the memory cell.

11. The multi-state sense amplifier as claimed in claim 1, wherein the memory cell is a memory cell having $2^N$ steady resistance states, wherein N is a number of the bits stored in the memory cell.

12. The multi-state sense amplifier as claimed in claim 1, wherein each of the reference cells is formed by coupling two resistors in parallel between the output terminals of the reference cells and a ground.

13. The multi-state sense amplifier as claimed in claim 1, wherein each of the reference cells is formed by coupling a plurality of resistors between the output terminals of the reference cells and a ground.

14. The multi-state sense amplifier as claimed in claim 1, wherein the multi-state sense amplifier is coupled to a plurality of comparators, each of which compares the memory cell voltage with one of the reference voltages to obtain a plurality of comparison result signals.

15. The multi-state sense amplifier as claimed in claim 14, wherein the comparators are coupled to a decoder decoding the comparison result signals to obtain data bits stored in the memory cell.

16. A memory, comprising:
   at least one memory cell, having changeable resistance;
   a plurality of reference cells, having different resistance;
   a multi-state sense amplifier, coupled to the memory cell and the reference cells, generating a memory cell voltage and a plurality of reference voltages according to the resistance of the memory cell and the resistance of the reference cells;
   a comparator, coupled to the multi-state sense amplifier, comparing the memory cell voltage and the reference voltages to obtain a comparison result signal; and
   a decoder, coupled to the comparator, decoding the comparison result signals to obtain N bits of data stored in the memory cell.

17. The memory as claimed in claim 16, wherein the multi-state sense amplifier comprises a source follower coupled between a first node and the output terminal of the memory cell, a source follower circuit coupled between a plurality of second nodes and the output terminals of the reference cells, and a current mirror circuit coupled to the first node and the second nodes.

18. The memory as claimed in claim 17, wherein the source follower clamps the voltage drop across the memory cell to generate a memory cell current flowing through the first node, the source follower circuit clamps the voltage drops across the reference cells to generate a plurality of reference currents respectively flowing through the second nodes, the current mirror circuit duplicates the memory cell current of the first node to affect the reference currents on the second nodes, thereby generating a memory cell voltage on the first node and a plurality of reference voltages on the second nodes.

19. The memory as claimed in claim 18, wherein the level of the memory cell current is determined according to the resistance of the memory cell, and the levels of the reference currents are respectively determined according to the resistances of the reference cells.

20. The memory as claimed in claim 18, wherein the current mirror circuit comprises:
    a first transistor, having a source coupled to a voltage source and a gate and a drain coupled to the first node, and generating the memory cell voltage on the first node; and
    a plurality of second transistors, having sources coupled to the voltage source, gates coupled to the first node, and drains respectively coupled to one of the second nodes, and generating the reference voltages on the second nodes.

21. The memory as claimed in claim 18, wherein the source follower comprises a third transistor, having a gate coupled to a second clamp voltage, a drain coupled to the first node, and a source coupled to the output terminal of the memory cell, and clamping the voltage drop across the memory cell, and the source follower circuit comprises a plurality of fourth transistors, having gates coupled to the second clamp voltage, drains respectively coupled to one of the second nodes, and sources coupled to one of the output terminals of the reference cells.

22. The memory as claimed in claim 17, wherein the multi-state sense amplifier further comprises a pre-charge circuit, coupled to the first node and the second nodes, coupling the first node and the second nodes according to a pre-charge signal to make the reference voltages identical to the memory cell voltage before the memory cell is read.

23. The memory as claimed in claim 22, wherein the pre-charge circuit comprises a plurality of first switches, respectively coupled between the first node and one of the second nodes, and the pre-charge signal turns on the first switches to couple the first node and the second nodes.

24. The memory as claimed in claim 17, wherein the multi-state sense amplifier further comprises a voltage clamp circuit, coupled to the second nodes, keeping the voltages of the second nodes at a first clamp voltage according to a voltage clamp signal when the memory cell is coupled to the multi-state sense amplifier.

25. The memory as claimed in claim 24, wherein the voltage clamp circuit comprises a plurality of second switches, respectively coupled between the first clamp voltage and one of the second nodes, and the voltage clamp signal turns on the second switches to couple the second nodes to the first clamp voltage.

26. The memory as claimed in claim 16, wherein the relative level between the memory cell voltage and the reference voltages reflects the relative level between the resistance of the memory cell and the resistances of the reference cells.

27. The memory as claimed in claim 16, wherein the memory cell is a Magnetic Random Access Memory (MRAM) cell having $2^N$ steady resistance states, each reference cell having a different resistance, and the number of the reference cells is $(2^N-1)$, wherein N is a number of the bits stored in the memory cell.

28. The memory as claimed in claim 16, wherein the memory cell is a memory cell having $2^N$ steady resistance states, wherein N is a number of the bits stored in the memory cell.

29. The memory as claimed in claim 16, wherein each of the reference cells is formed by coupling two resistors in parallel between the output terminals of the reference cells and a ground.

30. The memory as claimed in claim 16, wherein each of the reference cells is formed by coupling a plurality of resistors between the output terminals of the reference cells and a ground.

* * * * *